United States Patent
Tretz (10) Patent No.: US 7,954,077 B2
(45) Date of Patent: May 31, 2011

(54) INTEGRATED CIRCUIT DESIGN UTILIZING ARRAY OF FUNCTIONALLY INTERCHANGEABLE DYNAMIC LOGIC CELLS

(75) Inventor: Christophe Robert Tretz, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 508 days.

(21) Appl. No.: 12/061,155

(22) Filed: Apr. 2, 2008

(65) Prior Publication Data

US 2008/0189663 A1 Aug. 7, 2008

Related U.S. Application Data

(63) Continuation of application No. 11/128,069, filed on May 12, 2005, now Pat. No. 7,389,481.

(51) Int. Cl.
*G06F 17/50* (2006.01)

(52) U.S. Cl. ......... 716/126; 716/104; 716/136; 716/139

(58) Field of Classification Search .................. 716/104, 716/126, 136, 139
See application file for complete search history.

(56) References Cited

U.S. PATENT DOCUMENTS

| 6,181,163 | B1 | 1/2001 | Agrawal et al. |
| 2004/0000928 | A1* | 1/2004 | Cheng et al. ............... 326/41 |

* cited by examiner

*Primary Examiner* — Thuan Do
(74) *Attorney, Agent, or Firm* — Wood, Herron & Evans, LLP (57) ABSTRACT

A method utilizes an array of functionally interchangeable dynamic logic cells to implement an application specific logic function in an integrated circuit design. Each functionally interchangeable dynamic logic cell is comprised of a dynamic logic circuit configured to generate an output as a function of a plurality of inputs, and an output latch that is configured to latch the output generated by the logic circuit. The array of functionally interchangeable dynamic logic cells are used to implement an application specific logic function within a specific logic design by routing a plurality of conductors between inputs and outputs of at least a subset of the functionally interchangeable dynamic logic cells.

10 Claims, 5 Drawing Sheets

INTEGRATED CIRCUIT DESIGN UTILIZING ARRAY OF FUNCTIONALLY INTERCHANGEABLE DYNAMIC LOGIC CELLS

CROSS-REFERENCE TO RELATED APPLICATIONS

This application is a continuation of U.S. patent application Ser. No. 11/128,069, filed on May 12, 2005 by Christophe Robert Tretz, the entire disclosure of which is incorporated by reference herein.

FIELD OF THE INVENTION

The invention is generally related to integrated circuits and integrated circuit design, and in particular to synthesis of integrated circuit designs using standard logic cells.

BACKGROUND OF THE INVENTION

Electronic integrated circuits, or "chips" have become significantly more complex as circuit fabrication technologies have improved. It is not uncommon for integrated circuits to incorporate hundreds of millions of transistors, with a comparable number of interconnects, or signal paths, integrated together onto a single piece of silicon substrate no larger than the size of a coin. In addition, often the same functionality that once required multiple chips can now be integrated onto the same chip, a concept often referred to as "system-on-chip" technology.

The design of integrated circuits has likewise become more difficult as complexity has increased. Whereas early chips were often designed gate by gate, more advanced integrated circuits incorporating millions of gates represent too much of an undertaking for early design methodologies. Likewise, another important aspect of integrated circuit design is that of testing and verifying an integrated circuit design, both from the standpoint of verifying that a design will logically operate as intended, and of ensuring that a design will comply with the physical limitations that are inherent in any integrated circuit, i.e., to ensure that all timing and delay constraints are met.

As a result, a variety of software design applications, or tools, have been developed to assist designers with designing and testing integrated circuits.

Generally when utilizing these tools, the overall design process is represented by two stages. The first stage is referred to as logic design, where the desired functional operation of an integrated circuit is initially defined and tested. The second stage is referred to as physical design, where the logic design created during the logic design stage is processed to select actual circuit components to implement the functions defined in the logic design, and to lay out the components on an integrated circuit and route interconnects therebetween. The interconnections between circuit elements are often referred to as nets, and the nets are generally routed after placement of circuit components at specific locations on an integrated circuit.

Often, automated design tools rely on standardized circuit components, referred to as logic cells, which are self-contained, reusable and pre-tested circuit designs that represent specific higher level functions. Logic cells simplify a number of design steps. For example, logic design is simplified given that the logic synthesis tool is able to construct a circuit from fewer, more complex functions. Furthermore, both physical design and verification are often simplified because the logic cells function more or less like a "black box", whereas all of the individual gates and interconnects in a logic cell have already been placed relative to one another and tested beforehand.

In addition, some logic cells may be configured to provide different logical responses depending upon how they are interconnected with other circuit components. For example, a logic cell might be utilized to provide a generalized function such as A AND B AND C AND D AND E, where A-E are different inputs. Should one particular design only need to implement the function A AND B AND C, the D and E inputs could simply be connected to a logic 1 value to effectively remove those inputs from the function. Likewise, where only a function such as A AND B be needed in a different design, the C, D and E inputs could be connected to a logic 1 value, resulting in the same logic cell having a different logical response than in the first example.

Conventional logic design using logic cells, however, suffers from a number of drawbacks. Often the logic cells differ in size and shape, which can lead to inefficient space utilization when placed in a design. Furthermore, routing of the interconnects and clock signals is often haphazard and irregular, in many instances creating timing problems such as skew and jitter that require excessive testing and redesign.

In addition, conventional design methodologies and tools have typically been limited to use with logic cells implemented using static logic. More recently, however, dynamic logic has come into favor in circuit designs due to faster speed, lower power consumption, and reduced gate count. With dynamic logic, a clock signal is used to precondition a circuit of gates to a steady state during a precharge phase of the clock, then during an evaluate phase of the clock, a boolean function of the inputs of the circuit is evaluated and output by the circuit.

Logic synthesis tools have conventionally been unable to effectively utilize dynamic logic due in part to tighter stricter timing constraints associated with dynamic logic. In many cases, automated routing of the clock and interconnect signals is simply too irregular to meet the strict timing requirements of dynamic circuits.

Yet another drawback of conventional design methodologies arises when changes in the logic design a required at later stages of the development cycle. Oftentimes, dummy cells may be incorporated into a design to account for the possibility that the logic functions to be implemented in a circuit will be changed at a later point in the design process. If such dummy cells are never utilized, however, the space allocated to the dummy cell is effectively wasted, thus increasing the size and overall cost of the design.

Therefore, a significant need continues to exist for a circuit design methodology that supports the use of dynamic logic in a circuit design, as well as reduces the irregularities and inefficiencies associated with conventional methodologies and tools.

SUMMARY OF THE INVENTION

The invention addresses these and other problems associated with the prior art by providing a circuit arrangement, integrated circuit device, apparatus, program product, and method that utilize an array of functionally interchangeable dynamic logic cells to implement an application specific logic function in an integrated circuit design. Each functionally interchangeable dynamic logic cell is comprised of a dynamic logic circuit configured to generate an output as a function of a plurality of inputs, and an output latch that is configured to latch the output generated by the logic circuit. The array of functionally interchangeable dynamic logic cells are used to implement an application specific logic function within a specific logic design by routing a plurality of conductors between inputs and outputs of at least a subset of the functionally interchangeable dynamic logic cells.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

The embodiments discussed herein utilize an array of functionally interchangeable dynamic logic cells to implement application specific logic functions in an integrated circuit design.

A functionally interchangeable dynamic logic cell consistent with the invention incorporates an output latch implemented using static logic to capture a logic state generated by a dynamic logic circuit at a dynamic node in the cell. By doing so, the cell offers a stable storage element.

In addition, dynamic logic cells consistent with the invention are functionally interchangeable to the extent that each logic cell implements the same logical function such that any logic cell in an array may be substituted for another logic cell in the array when mapping the desired application specific logic function to the array of logic cells. While in many embodiments each functionally interchangeable dynamic logic cell may be identical also in terms of physical design and layout, in other embodiments different cells may have different physical designs, so long as they implement the same logical function. It will also be appreciated that various types of arrays may be utilized, including both one and two dimensional arrays, as well as regular and non-regular arrays. In many embodiments, for example, it is desirable to implement logic cells that are rectangular or square in shape and identical to one another in size, and laid out in a regular two dimensional array.

Moreover, it will be appreciated that, while each cell implements the same logical function, through the interconnection of different inputs to different logic signals and/or tying different inputs to constant voltages representing logic "1" or logic "0" values, each cell can be configured to provide a different logical response. It is typically through the specific configuration of the interconnects coupling together the logic cells in the array that an application specific logic function is derived from the standard logic functions implemented by the logic cells in the array.

In one specific implementation discussed hereinafter, a single unique complex logic cell is placed in a regular two dimensional array, and is the only cell used by the synthesis tool when implementing an application specific logic function. The logic cell is implemented using a Limited Switch Dynamic Logic (LSDL) configuration, where a dynamic logic circuit is coupled to a clocked latch structure that provides the output for the logic cell. As will become more apparent below, the logic complexity of the unique cell provides a good match between custom and synthesized blocks, and moreover, the regular array structure allows for a solid clock distribution scheme and a regular placement of latches and local clock buffers.

Furthermore, in the aforementioned implementation, there is no issue with cell placement since all cells are identical. As a result, the synthesis tool does not need to connect one gate to the closest gate of a specific type, but only to the closest available gate. In addition, since all cells are unique and identical, it becomes relatively simple to perform even complex Engineering Change Order's (ECO's) very late in the design cycle. Given the complexity of each logic cell, even complex changes in the function implemented by a given design may be incorporated without front end modification, and often there is no need to have an optimization scheme in terms of dummy gates or cells that could be used for future ECO's. Instead, existing cells are simply reconfigured to implement different functions consistent with the necessary changes.

Figure 1:
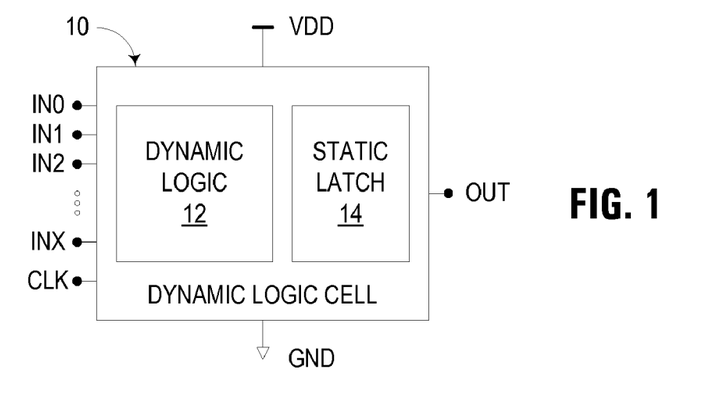
FIG. 1 is a functional block diagram of a functionally interchangeable dynamic logic cell consistent with the invention.

Turning now to the Drawings, wherein like numbers denote like parts throughout the several views, FIG. 1 illustrates an exemplary functionally interchangeable dynamic logic cell 10 consistent with the invention. Logic cell 10 incorporates a dynamic logic circuit 12 that is used to generate at an internal dynamic node therein a logical value as a function of the values received on a plurality of inputs $IN_0$-$IN_X$ and a static latch 14 that is used to sample and latch the logical value generated on the dynamic load and output therefrom an output signal OUT. While not shown in FIG. 1, logic cell 10 may also output an inverted output signal in addition to or in lieu of OUT.

Logic cell 10 also receives as input a clock signal CLOCK, along with VDD and GND inputs. It will be appreciated that in different embodiments, multiple CLOCK, VDD and/or GND inputs may be provided in a logic cell to facilitate interconnection with surrounding circuitry, and that multiple clock signals may be used. In addition, the number of inputs provided to the logic cell may vary depending upon the standardized function implemented by the dynamic logic therein.

Figure 2:
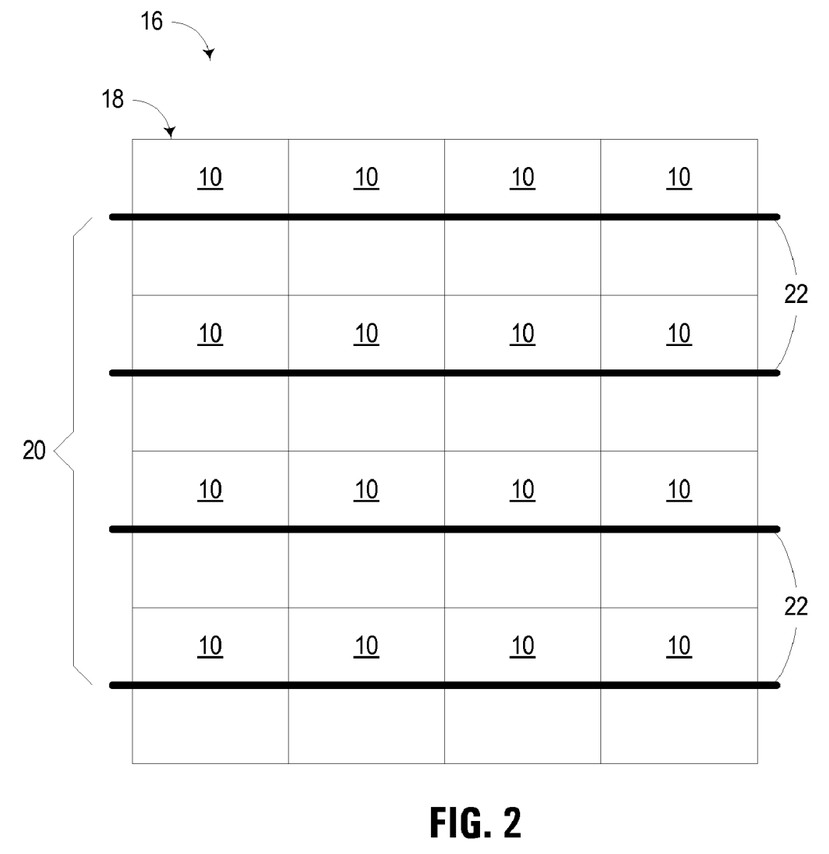
FIG. 2 is a block diagram of an integrated circuit device incorporating an array of the functionally interchangeable dynamic logic cells of FIG. 1.

As noted above, logic cell 10 is typically utilized in an array to implement an application specific logic function. FIG. 2, for example, illustrates a portion of an integrated circuit device, or chip, 16 incorporating an array 18 of logic cells 10.

Array 18 is a two dimensional regular array, with each logic cell 10 being square in shape, and having the same external dimensions. It will be appreciated, however, that different array layouts can be used, e.g., with individual logic cells staggered in adjacent rows or columns, with islands of individual cells placed near other islands of different individual cells, etc. It will also be appreciated that while array 18 is shown as a 4×4 array, any number of cells may be disposed in an array consistent with the invention.

Also incorporated in array 18 is a clock distribution network or tree 20, including a plurality of clock lines or nets 22. Clock lines 22 are also disposed in a regular array, and due to the regular and repeating nature of the logic cells 10, clock loading can be determined in advance, allowing for clock distribution to be more controlled and stable, and allowing for optimization prior to layout. In many implementations, for example, the regular nature of both the array of logic cells and the clock distribution tree eliminates the need to synthesize either the arrays or the clock distribution tree. Instead, synthesis consists primarily of routing interconnects to appropriate logic cells to implement the desired logic function.

It may also be desirable in some implementations to include clock buffers in a clock distribution network consistent with the invention. Moreover, given the ability to utilize a regular array of logic cells and clock nets, it may also be desirable to utilize a regular array of local clock buffers (LCB's) in an integrated circuit design consistent with the invention.

Figure 3:
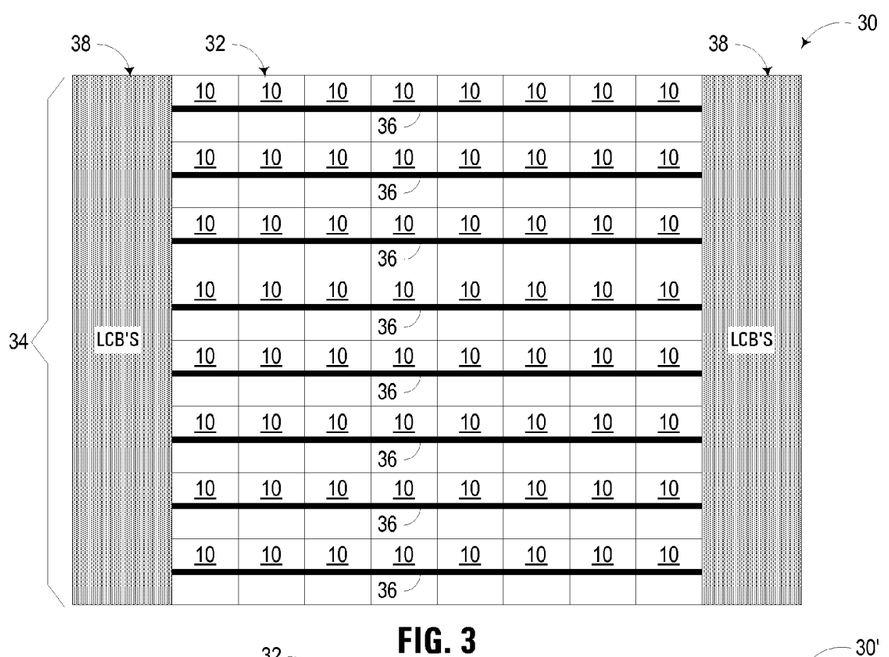
FIG. 3 is a block diagram of an exemplary array of functionally interchangeable dynamic logic cells, incorporating a clock distribution circuit with arrays of local clock buffers disposed along a periphery of the exemplary array.

FIG. 3, for example, illustrates a physical layout of a design 30 incorporating a regular two dimensional array 32 of logic cells 10. In this implementation a clock distribution network 34 includes a plurality of equidistant and parallel horizontally disposed clock nets 36. In addition, vertical arrays 38 of LCB's are disposed along the periphery at each end of array 32 to repower clock nets 36.

Figure 4:
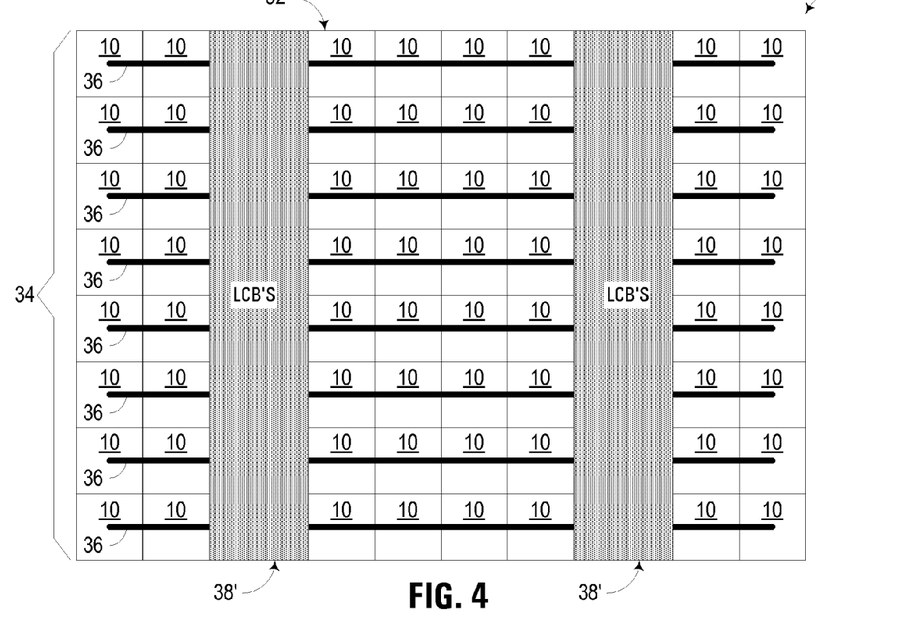
FIG. 4 is a block diagram of another exemplary array of functionally interchangeable dynamic logic cells, incorporating a clock distribution circuit with arrays of local clock buffers interposed within the exemplary array.

LCB's may be disposed in other structures of a circuit design in other implementations. For example, FIG. 4 illustrates an alternate design 30' wherein a clock distribution network 34' includes vertical arrays 38' of LCB's interposed or interleaved within the array 32 of logic cells 10. In some circumstances, however, the implementation of FIG. 3 may have an advantage over that of FIG. 4 as signals that may be required to be propagated from one side of an array of LCB's to the other would require relatively longer wires, potentially leading to timing issues. On the other hand, the implementation of FIG. 4 may have an advantage in larger arrays due to the reduced length of the clock nets.

As such, in contrast with conventional synthesis tools where latches, gates and buffers are placed haphazardly over a floor plan, which forces clock nets to likewise differ from one another in terms of routing and line length, clock nets in the illustrated implementations are more regular and stable, thus minimizing clock delay variations and clock skew.

The herein-described dynamic logic cells are utilized in connection with the generation of circuit arrangements incorporating a circuit design implementing an application specific logic function. Ultimately, such circuit arrangements are typically embodied on an integrated circuit device or chip. It should also be recognized, however, that circuit arrangements are typically designed and fabricated at least in part using one or more computer data files, referred to herein as circuit design files, that define the logic and/or layout of the circuit arrangements on integrated circuit devices. The files are typically generated in a known manner by various design tools and utilized at different stages of the design process, and are ultimately used to generate information suitable for creating the layout masks that define the circuit arrangements applied to a semiconductor wafer. These design files are typically stored on a computer readable medium and are read and processed by a computer or other electronic device at various stages of the design process; however, such files may also be distributed in the form of a program product and borne on a transmission or recordable type computer readable medium.

As also noted above, the illustrated implementations desirably utilize Limited Switch Dynamic Logic (LSDL) dynamic logic cells, e.g., as described in greater detail in U.S. Pat. No. 6,690,204, the disclosure of which is incorporated by reference herein. In general, any number of complex logic functions may be implemented by a dynamic logic cell consistent with the invention, with a tradeoff typically existing between the complexity of the potential logic function implemented by a logic cell and the area and performance of the cell. In particular, the more complex a logic function that is implemented, the greater the likelihood that a portion of one or more cells in an array will go unused in the final synthesized logic design, thus wasting space and needlessly compromising performance.

Figure 5:
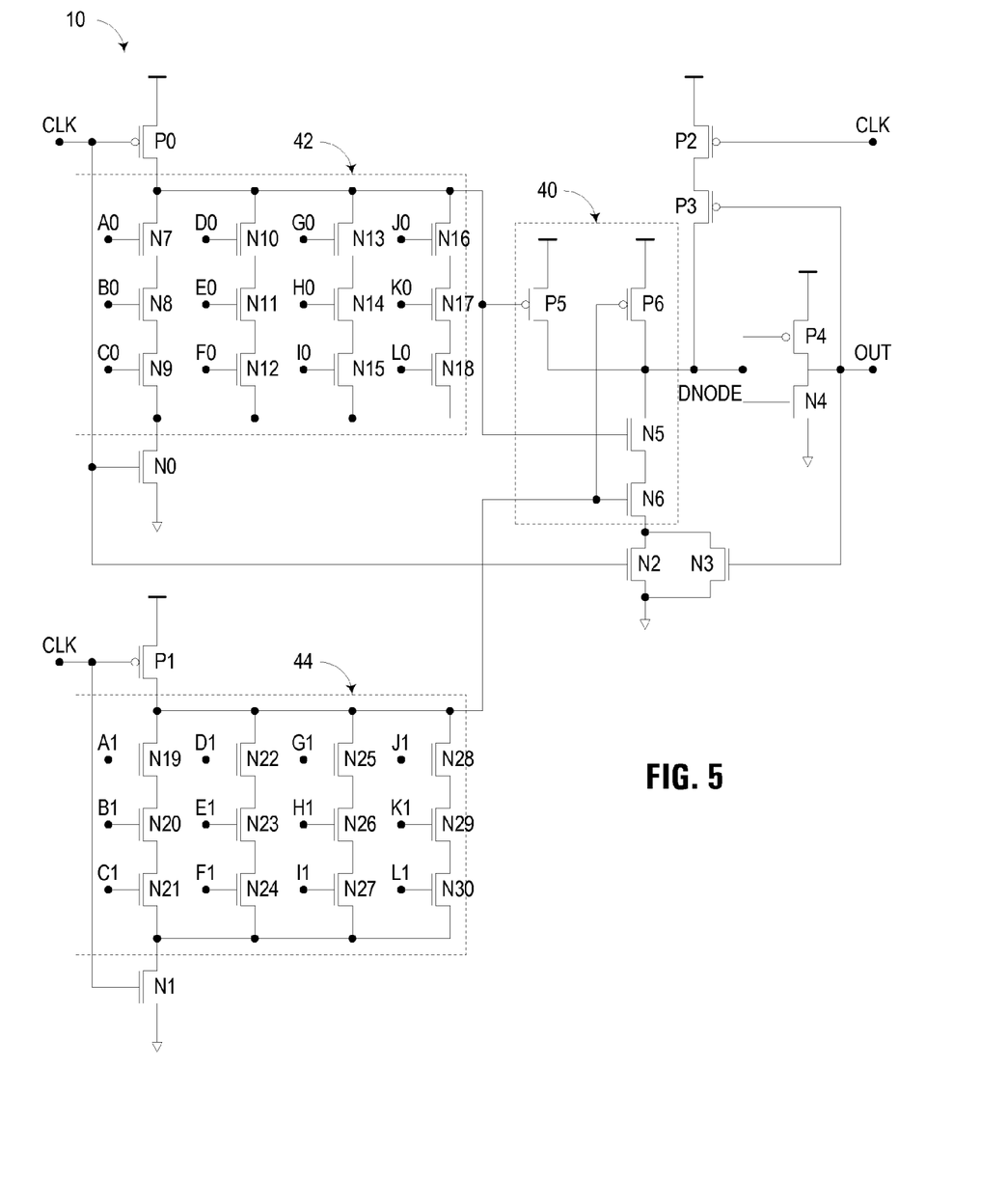
FIG. 5 is a circuit diagram of an exemplary implementation of the functionally interchangeable dynamic logic cell of FIG. 1.
Figure 6:
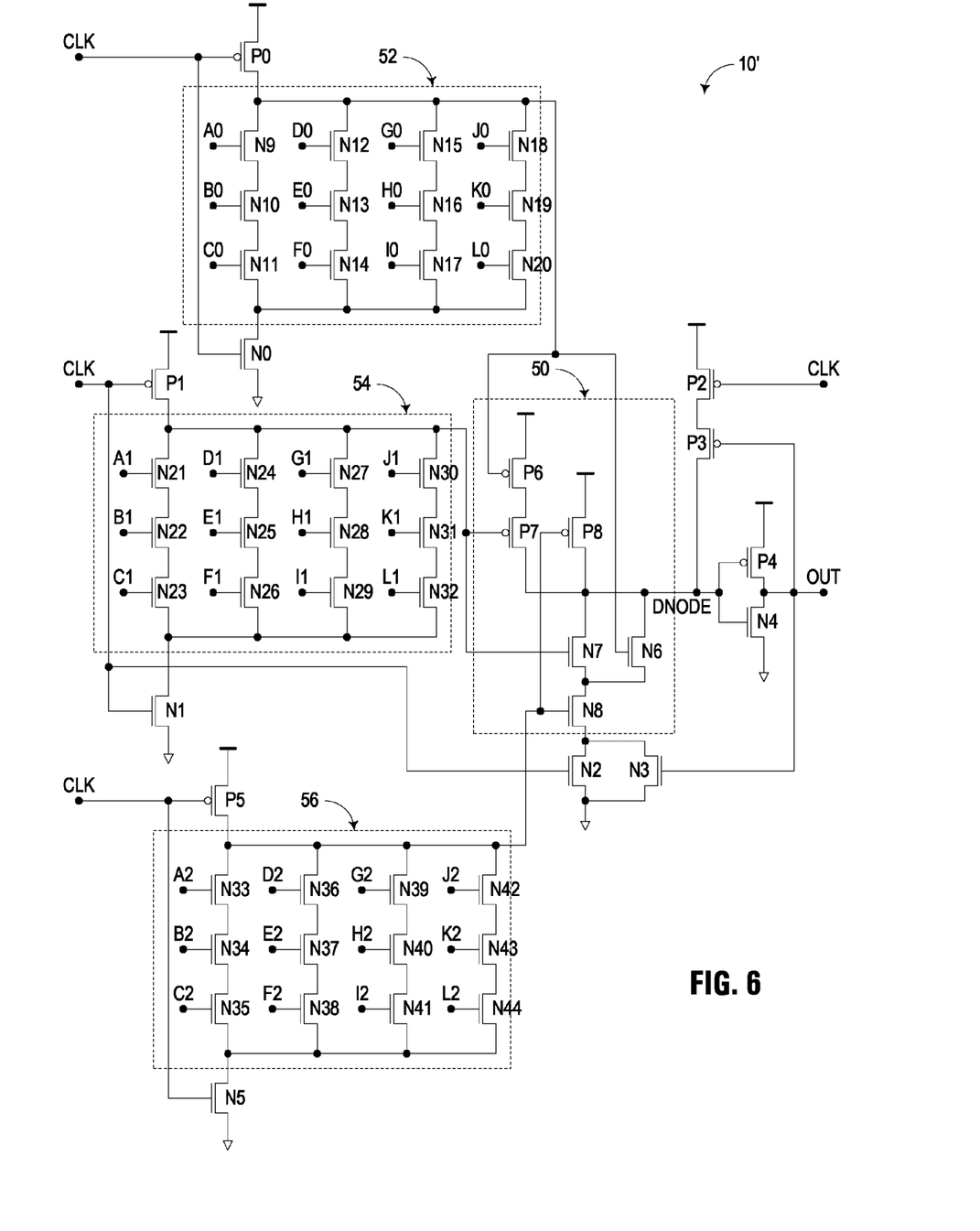
FIG. 6 is a circuit diagram of another exemplary implementation of the functionally interchangeable dynamic logic cell of FIG. 1.

FIGS. 5 and 6, for example, illustrate two potential logic cell implementations representing a good balance between complexity and performance. It will be appreciated that an innumerable number of other designs may be used in the alternative.

FIG. 5, in particular, illustrates an implementation of a circuit design for logic cell 10, which receives as inputs up to 24 signals (designated $A_0$-$L_0$ and $A_1$-$L_1$), grouped into eight input sets of three inputs each, and which logically AND's the inputs in each set together and logically OR's the result of each input set. Expressed mathematically, the output signal OUT of logic cell 10 is derived from the inputs according to the logic function:

$$\text{OUT}=(A_0B_0C_0+D_0E_0F_0+G_0H_0I_0+J_0K_0L_0)+(A_1B_1C_1+D_1E_1F_1+G_1H_1I_1+J_1K_1L_1)$$

Logic cell 10 is implemented using CMOS logic, including NFET's N0-N30 and PFET's P0-P4. A logic function is implemented in a dynamic logic portion of logic cell 10 using boolean circuits 40, 42 and 44, with circuit 42 being coupled intermediate P0 and N0, and circuit 44 being coupled intermediate P1 and N1. The resolution of the boolean function implemented by circuits 40, 42 and 44 is maintained on a dynamic node labeled DNODE in FIG. 5. A static logic portion of logic cell 10 latches the value maintained on DNODE, and implements an inverting latch comprising P2, P3, P4, N2, N3 and N4.

P0-P2 and N0-N2 are driven by the clock signal CLK, such that P0, P1 and P2 are active during a precharge phase of the CLK signal, and N0, N1 and N2 are active during an evaluation phase of the CLK signal. P4 and N4 form an inverter that is coupled to a dynamic node DNODE, serving to invert the value maintained at DNODE and provide the output signal OUT. OUT is fed back to drive both P3 and N3, thus implementing a static latch to maintain the previous value on DNODE during an evaluation phase of CLK. It will be appreciated that other latch implementations may be used in the alternative.

It will be appreciated that the circuit configuration of P0-P4 and N0-N4 implement a generic LSDL circuit that is capable of implementing any number of boolean logic functions depending upon the configuration of each of circuits 40, 42 and 44 (and furthermore, based upon the number of circuits such as circuits 42 and 44 that are coupled to circuit 40. In the configuration of FIG. 5, for example, circuit 40, comprising P5, P6, N5 and N6, performs a logical OR and inversion of the outputs of each of circuits 42, 44. Circuit 42, comprising N7-N18, implements the function $A_0B_0C_0+D_0E_0F_0+G_0H_0I_0+J_0K_0L_0$, and circuit 44, comprising N19-N30, implements the function $A_1B_1C_1+D_1E_1F_1+G_1H_1I_1+J_1K_1L_1$. It will be appreciated that in each circuit 42, 44, the number of input sets and/or the number of inputs within each input set, may vary in different embodiments.

FIG. 6, illustrates an alternate implementation 10' of a circuit design for a functionally interchangeable dynamic logic cell, which receives as inputs up to 36 signals (designated $A_0$-$L_0$, $A_1$-$L_1$ and $A_2$-$L_2$), grouped into twelve input sets of three inputs each, and which logically AND's the inputs in each set together, logically OR's the result of the first eight input sets, and then logically AND's that result with the result of the last four input sets. Expressed mathematically, the output signal OUT of logic cell 10' is derived from the inputs according to the logic function:

$$OUT=[(A_0B_0C_0+D_0E_0F_0+G_0H_0I_0+J_0K_0L_0)+(A_1B_1C_1+D_1E_1F_1+G_1H_1I_1+J_1K_1L_1)]*(A_2B_2C_2+D_2E_2F_2+G_2H_2I_2+J_2K_2L_2)$$

Logic cell 10' is implemented using NFET's N0-N44 and PFET's P0-P8, where N0-N4 and P0-P4 are configured in a similar manner to logic cell 10 of FIG. 5. A logic function is implemented in a dynamic logic portion of logic cell 10' using boolean circuits 50, 52, 54 and 56. The resolution of the boolean function implemented by circuits 50, 52, 54 and 56 is maintained on a dynamic node labeled DNODE in FIG. 6. A static logic portion of logic cell 10' latches the value maintained on DNODE, and implements an inverting latch comprising N2-N4 and P2-P4.

Of note, logic cell 10' functions in much the same manner as logic cell 10 of FIG. 5, with the exception of the addition of circuit 56 and P2 and N2, and the configuration of circuit 50. Specifically, as with circuits 42 and 44, circuit 52, comprising N9-N20, implements the function $A_0B_0C_0+D_0E_0F_0+G_0H_0I_0+J_0K_0L_0$, while circuit 54, comprising N21-N32, implements the function $A_1B_1C_1+D_1E_1F_1+G_1H_1I_1+J_1K_1L_1$. Circuit 56, comprising N33-N44, similarly implements the function $A_2B_2C_2+D_2E_2F_2+G_2H_2I_2+J_2K_2L_2$. However, unlike circuit 40, which implements a logical OR and inversion, circuit 50 performs a logical OR of the outputs of circuits 52 and 54, followed by a logical AND of that result with the output of circuit 56. The result is then inverted by the inverter implemented by P5 and N5 to generate the output signal OUT.

It will be appreciated by one of ordinary skill in the art having the benefit of the instant disclosure that, by selecting suitable boolean logic circuits for implementation within the general circuit framework of FIGS. 5 and 6, practically any complex boolean function may be implemented in a logic cell consistent with the invention. The invention is therefore not limited to the particular implementations discussed herein. Moreover, it will be appreciated that the implementation of a logical and/or physical design for the logic cells described herein would be well within the abilities of one of ordinary skill in the art having the benefit of the instant disclosure.

Figure 7:
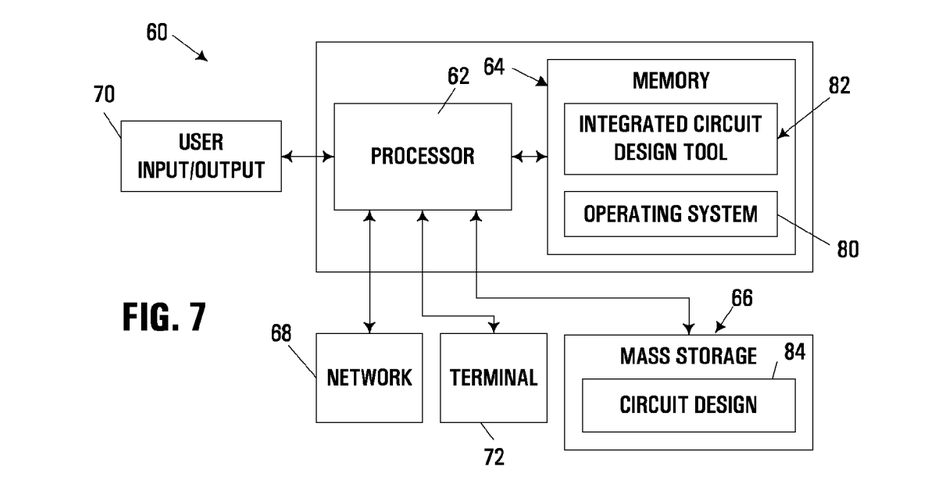
FIG. 7 is a block diagram of an apparatus hosting an integrated circuit design tool suitable for performing an integrated circuit design process in a manner consistent with the invention.

FIG. 7 next illustrates an exemplary hardware and software environment for an apparatus 60 suitable for implementing logic synthesis in a manner consistent with the invention. For the purposes of the invention, apparatus 60 may represent practically any type of computer, computer system or other programmable electronic device, including a client computer, a server computer, a portable computer, a handheld computer, an embedded controller, etc. Moreover, apparatus 60 may be implemented using one or more networked computers, e.g., in a cluster or other distributed computing system. Apparatus 60 will hereinafter also be referred to as a "computer", although it should be appreciated the term "apparatus" may also include other suitable programmable electronic devices consistent with the invention.

Computer 60 typically includes at least one processor 62 coupled to a memory 64. Processor 62 may represent one or more processors (e.g., microprocessors), and memory 64 may represent the random access memory (RAM) devices comprising the main storage of computer 60, as well as any supplemental levels of memory, e.g., cache memories, non-volatile or backup memories (e.g., programmable or flash memories), read-only memories, etc. In addition, memory 64 may be considered to include memory storage physically located elsewhere in computer 60, e.g., any cache memory in a processor 62, as well as any storage capacity used as a virtual memory, e.g., as stored on a mass storage device 66 or on another computer coupled to computer 60 via network 68.

Computer 60 also typically receives a number of inputs and outputs for communicating information externally. For interface with a user or operator, computer 60 may include one or more user input/output devices 70 (e.g., for input, a keyboard, a mouse, a trackball, a joystick, a touchpad, and/or a microphone; and for output, a CRT monitor, an LCD display panel, and/or a speaker, among others). Otherwise, user input may be received via a remote terminal or workstation 72, and/or via another computer interfaced with computer 60 over network 68.

For additional storage, computer 60 may also include one or more mass storage devices 66, e.g., a floppy or other removable disk drive, a hard disk drive, a direct access storage device (DASD), an optical drive (e.g., a CD drive, a DVD drive, etc.), and/or a tape drive, among others. Furthermore, computer 60 may include an interface with one or more networks 68 (e.g., a LAN, a WAN, a wireless network, and/or the Internet, among others) to permit the communication of information with other computers coupled to the network. It should be appreciated that computer 60 typically includes suitable analog and/or digital interfaces between processor 62 and each of components 64, 66, 68, 70 and 72 as is well known in the art.

As is common in connection with integrated circuit design, computer 60 is typically a multi-user computer such as a server, midrange computer, mainframe computer, with user input and output conducted with circuit designers and testers via one or more external computers coupled to computer 60 via a terminal or a networked computer. However, the invention is not limited to such an environment.

Computer 60 operates under the control of an operating system 80, and executes or otherwise relies upon various computer software applications, components, programs, objects, modules, data structures, etc. (e.g., integrated circuit design tool 82, among others). Moreover, various applications, components, programs, objects, modules, etc. may also execute on one or more processors in another computer coupled to computer 60 via a network 68, e.g., in a distributed or client-server computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions, or even a subset thereof, will be referred to herein as "computer program code," or simply "program code." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of computer readable media used to actually carry out the distribution. Examples of computer readable media include but are not limited to recordable type media such as volatile and non-volatile memory devices, floppy and other removable disks, hard disk drives, magnetic tape, optical disks (e.g., CD-ROM's, DVD's, etc.), among others, and transmission type media such as digital and analog communication links.

In addition, various program code described hereinafter may be identified based upon the application or tool within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

Logic synthesis consistent with the invention is typically implemented within an integrated circuit design environment that includes a tool 82, which may be used to develop and test a circuit design 84 (shown resident in mass storage 66) suitable for use in manufacturing an integrated circuit. However, it should be appreciated that the various functions associated with designing and testing an integrated circuit may be handled by different computer programs that collectively represent the functionality of integrated circuit design tool of FIG. 7. Different collections of computer programs, incorporating different design and/or testing functionality, may be used in other embodiments, and may or may not be integrated together into a common tool or suite. Moreover, it will be appreciated that circuit design 84 may include one or more design files incorporating any number of different formats, and appropriate for various stages during the circuit design process (e.g., different files storing hardware description language information, logic design information, layout information, physical design information, verification/test information, etc.). As such, the invention is not limited to implementation within the particular collection of computer programs described herein.

Figure 8:
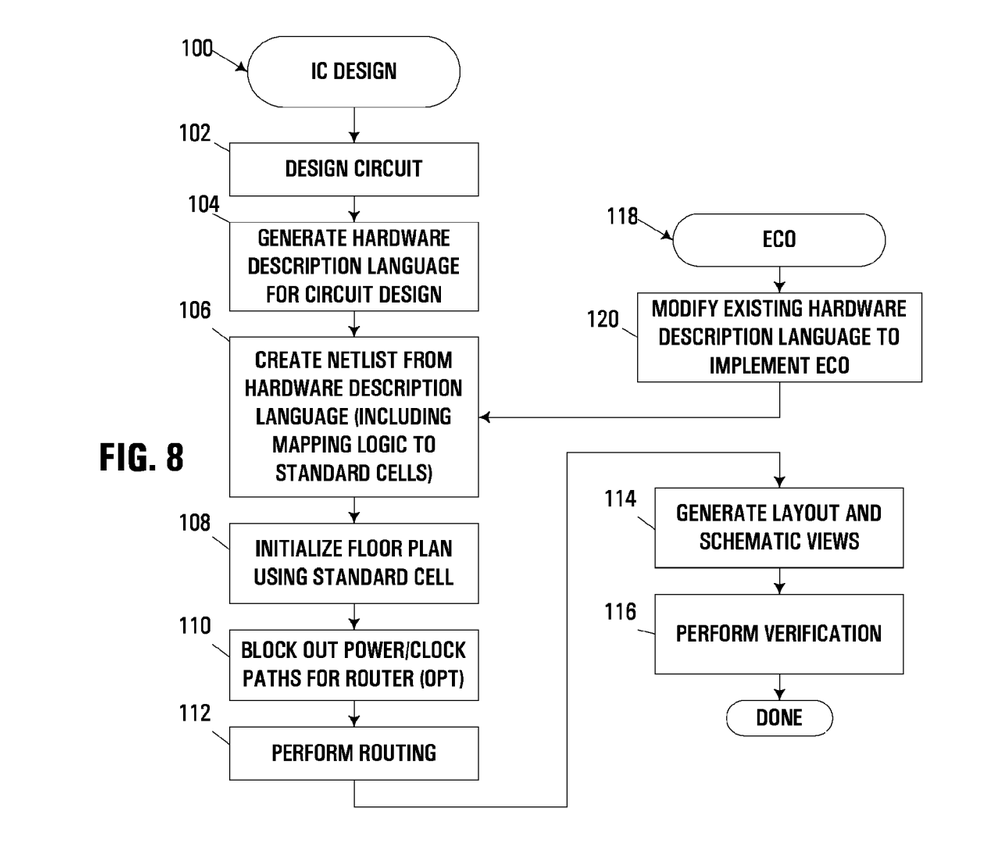
FIG. 8 is a flowchart illustrating an integrated circuit design process performed using the integrated circuit design tool of FIG. 7.

FIG. 8 next illustrates the principal steps in an exemplary integrated circuit design process 100 using the integrated circuit design tool of FIG. 7. It is assumed for the purposes of FIG. 8 that the complete circuit is implemented using the functionally interchangeable dynamic logic cells described herein. It will be appreciated, however, that functionally interchangeable dynamic logic cells may be utilized in some environments to implement only a subset of the application specific logic utilized in a particular circuit design. For example, other methodologies may be used to implement other application specific logic and/or additional design steps may be used to provide any support circuitry necessary in the final physical design.

Furthermore, as will be discussed in greater detail below, the use of a regular array of the aforementioned functionally interchangeable dynamic logic cells, coupled with the aforementioned regular clock distribution network, greatly simplifies many of the steps in the design process. In particular, the use of regular structures enables the floor plan of the synthesized logic to be preplanned, including, if desirable, a clock distribution circuit that has been optimized for the preplanned floor plan, such that logic synthesis is in many ways reduced to simply finding the appropriate connectivity between logic cells to implement the desired application specific logic function. Furthermore, due to the fact that the aforementioned dynamic logic cells incorporate static latches, each cell functions as a latch from the standpoint of logic synthesis, and is thus suitable for use in connection with a number of conventional static logic-based methodologies.

Process 100 begins in block 102 by initially designing a circuit in response to user input, e.g., from a circuit designer. Next, in block 104, a hardware description language file (e.g., in VHDL) is generated for the circuit design Next, logic synthesis is performed in block 106 to create a netlist from the hardware description language file. In addition, at this point, the logic synthesis maps the application specific logic function(s) defined in the hardware description language to functionally interchangeable dynamic logic cells. For example, any number of conventional cell-based logic synthesis methodologies may be used, but constrained to create the netlist using only one or more standard cells that implement functionally interchangeable dynamic logic cells as described herein. In one embodiment, for example, a library of cells available to a logic synthesis tool may be limited to a single standard dynamic logic cell.

Next, in block 108 a floor plan is initialized using the standard cell. In the illustrated implementation, a floor plan may be dynamically constructed by tiling a sufficient number of standard cells required to implement the desired function. In the alternative, a predesigned floor plan having the desired number of standard cells may simply be retrieved and placed as a single unit. The floor plan may also include appropriate power, ground and clock lines, as well as arrays of LCB's if desired. Furthermore, any or all of the latter circuit elements may be integrated within the standard cell itself. In some implementations, it may be desirable to incorporate all of the necessary power and ground connections, as well as a preplanned, optimized clock distribution network in a floor plan so that little or no customized routing of power, ground, or clock lines is required after initialization of the floor plan. In other embodiments, however, some routing and/or placement of some of these circuit elements may be required after placement of an array of standard cells has occurred. In still other embodiments, floor plans may consist of multiple standard cells, with multiple floor plans joined together to provide the requisite number of standard cells for implementing a desired function.

Next, in block 110, if necessary, power and clock paths are optionally blocked out in advance of routing, which occurs in block 112. Then, in block 114, one or more views, e.g., layout and schematic views, are created as required for the purposes of verification, manufacturing, etc. At least a portion of these views are used to perform verification, as shown in block 116. If no problems are encountered during verification, process 100 is complete. In the event that problems such as timing problems are detected during verification, conventional rework processes, e.g., through manually or automatically repeating any number of the preceding steps in the aforementioned design process, may be utilized.

Another benefit of the herein described implementations is the ability to address design changes such as ECO's, even relatively late in the design process. Since all logic cells are functionally interchangeable, changes in the implemented function typically only require rerouting of connectors, rather than adding or removing individual gates and/or cells and/or requiring front end modifications. In addition, the need for dummy gates or cells is reduced or eliminated as any "extra" gates or cells in the illustrated embodiment will have the same configuration as the other logic cells, so an ECO may only require any given cell to be reused with a different programming of its inputs. As such, as is also illustrated at block 118 in FIG. 8, the aforementioned design process may also be utilized to implement design changes simply through the modification of the existing hardware description language information for a design, as illustrated in block 120, followed by repeating thereafter the steps starting at block 106.

It will be appreciated that additional steps associated with the design, verification and/or manufacturing processes for an integrated circuit may be required in some implementations, but are not shown in FIG. 8 for ease of illustration. For example, where different tools are utilized to perform different steps, data conversions may be required prior to utilizing certain tools in the process. Moreover, other conventional process steps may be utilized when other methodologies are utilized for other functions in an integrated circuit device, e.g., where functionally interchangeable dynamic logic cells are used to implement only a portion of the logic on a device.

It will also be appreciated that the implementation of the herein-described design processes would be well within the abilities of one of ordinary skill in the art having the benefit of the instant disclosure. For example, it will be appreciated that a number of conventional static logic-based design tools, processes and methodologies may be readily adapted for use in designing an integrated circuit using the herein described functionally interchangeable dynamic logic cells. In some implementations, existing tools and methodologies may simply utilize a standard cell library that only contains a single functionally interchangeable dynamic logic cell, such that the various design processes operate in much the same manner as a conventional design process, but with all placed logic being implemented using the herein-described dynamic logic cells.

Various modifications may be made to the illustrated embodiments consistent with the invention. For example, the logic cell circuit designs described herein implement a relatively basic LSDL structure. As such, other known LSDL or other enhancements, e.g., for noise immunity, gate stability, etc., may be incorporated into logic cells as desired.

Various additional modifications may be made to the illustrated embodiments without departing from the spirit and scope of the invention. Therefore, the invention lies in the claims hereinafter appended.

What is claimed is:

1. A method of designing a circuit arrangement, the method comprising:
   using a computer machine, laying out an array of functionally interchangeable dynamic logic cells, wherein each functionally interchangeable dynamic logic cell includes a plurality of inputs, a logic circuit configured to generate an output as a function of the plurality of inputs using dynamic logic, and an output latch configured to latch the output of the logic circuit, wherein the dynamic logic in the logic circuit is responsive to a clock signal that precharges the dynamic logic during a precharge phase of the clock signal and evaluates the dynamic logic during an evaluate phase of the clock signal to generate the output for the logic circuit as a function of the plurality of inputs; and
   using a computer machine, configuring the array of functionally interchangeable dynamic logic cells to collectively implement an application specific logic function by routing a plurality of conductors to electrically interconnect inputs and outputs of at least a subset of the functionally interchangeable dynamic logic cells.

2. The method of claim 1, wherein each functionally interchangeable dynamic logic cell includes a portion of a clock distribution circuit such that laying out of the array of functionally interchangeable dynamic logic cells includes laying out a clock distribution circuit.

3. The method of claim 1, wherein laying out the array of functionally interchangeable dynamic logic cells includes initializing a floor plan that includes a regular array of functionally interchangeable dynamic logic cells and a preplanned regular clock distribution circuit integrated therewith.

4. The method of claim 3, further comprising optimizing the preplanned regular clock distribution circuit prior to laying out the array of functionally interchangeable dynamic logic cells.

5. The method of claim 3, wherein the regular array of functionally interchangeable dynamic logic cells is a two dimensional array, and wherein the preplanned regular clock distribution circuit comprises a plurality of clock nets extending in a first dimension and a plurality of rows of local clock buffers extending in a second dimension that is generally orthogonal to the first dimension.

6. The method of claim 1, wherein routing the plurality of conductors to electrically interconnect inputs and outputs of at least a subset of the functionally interchangeable dynamic logic cells includes connecting at least one input of a functionally interchangeable dynamic logic cell to a constant voltage.

7. The method of claim 1, wherein the plurality of inputs in each dynamic logic cell includes a plurality of input sets, and wherein the logic circuit of each dynamic logic cell is configured to logically AND the inputs of each input set together to generate an output signal therefore, and to logically OR the output signals of the plurality of input sets to generate the output of the logic circuit.

8. The method of claim 1, wherein the plurality of inputs in each dynamic logic cell includes a plurality of input sets, wherein each dynamic logic cell includes first, second and third dynamic logic circuits, wherein each of the first, second and third dynamic logic circuits is respectively configured to logically AND inputs of a subset of input sets together to generate an output signal therefore, and to logically OR the output signals of the respective subsets of input sets to generate respective first, second and third outputs, and wherein the logic circuit is configured to logically AND the first output with a logical OR of the second and third outputs.

9. The method of claim 1, wherein each functionally interchangeable dynamic logic cell comprises a limited switch dynamic logic (LSDL) circuit.

10. The method of claim 1, further comprising, after configuring the array of functionally interchangeable dynamic logic cells to collectively implement the application specific logic function, reconfiguring the array of functionally interchangeable dynamic logic cells to collectively implement a modified application specific logic function by rerouting at least a subset of the plurality of conductors.

* * * * *